United States Patent
Jiang

(10) Patent No.: US 7,672,086 B1
(45) Date of Patent: Mar. 2, 2010

(54) METHOD AND SYSTEM FOR PROVIDING A MAGNETIC ELEMENT HAVING A CURRENT CONFINED LAYER

(75) Inventor: Hai Jiang, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 723 days.

(21) Appl. No.: 10/833,460

(22) Filed: Apr. 28, 2004

(51) Int. Cl.
 *G11B 5/127* (2006.01)
(52) U.S. Cl. .................................................. 360/324.1
(58) Field of Classification Search .............. 360/324.1, 360/324.11, 324.12, 322, 324.2; 428/328, 428/811, 811.3
See application file for complete search history.

(56) References Cited

U.S. PATENT DOCUMENTS

| | | | |
|---|---|---|---|
| 5,652,054 A * | 7/1997 | Kikitsu et al. ................ | 428/328 |
| 5,715,121 A * | 2/1998 | Sakakima et al. ......... | 360/324.2 |
| 5,966,275 A * | 10/1999 | Iijima ...................... | 360/324.2 |
| 5,991,113 A | 11/1999 | Meyer et al. | |
| 6,183,890 B1 * | 2/2001 | Fujita ......................... | 428/811 |
| 6,473,259 B1 | 10/2002 | Kuo et al. | |
| 6,501,606 B2 | 12/2002 | Boutaghou et al. | |
| 6,570,730 B1 | 5/2003 | Lewis et al. | |
| 6,574,079 B2 * | 6/2003 | Sun et al. .................. | 360/324.2 |
| 6,686,068 B2 * | 2/2004 | Carey et al. .............. | 428/811.3 |
| 6,700,724 B2 | 3/2004 | Riddering et al. | |
| 6,937,447 B2 * | 8/2005 | Okuno et al. ............. | 360/324.1 |
| 7,057,921 B2 * | 6/2006 | Valet ........................... | 365/158 |
| 7,088,609 B2 * | 8/2006 | Valet ........................... | 365/158 |
| 7,161,829 B2 * | 1/2007 | Huai et al. .................. | 365/158 |
| 7,242,048 B2 * | 7/2007 | Huai ........................... | 257/295 |
| 2003/0043497 A1 | 3/2003 | Riddering et al. | |
| 2003/0081359 A1 | 5/2003 | Pust et al. | |
| 2004/0012894 A1 | 1/2004 | Pust et al. | |
| 2004/0042127 A1 * | 3/2004 | Hoshiya et al. ............. | 360/322 |
| 2004/0052008 A1 * | 3/2004 | Sugawara ............... | 360/324.11 |
| 2005/0002126 A1 * | 1/2005 | Fujiwara et al. .......... | 360/324.1 |
| 2005/0063222 A1 * | 3/2005 | Huai et al. .................. | 365/171 |
| 2005/0136600 A1 * | 6/2005 | Huai ........................... | 438/296 |
| 2005/0254286 A1 * | 11/2005 | Valet ........................... | 365/158 |
| 2005/0254287 A1 * | 11/2005 | Valet ........................... | 365/158 |
| 2006/0192237 A1 * | 8/2006 | Huai ........................... | 257/296 |

OTHER PUBLICATIONS

Tanaka et al., "Spin-Valve Heads in the Current-Perpendicular-to-Plane Mode for Ultrahigh-Density Recording", IEEE Transactions on Magnetics, vol. 38, No. 1, Jan. 2002, pp. 84-88.
Takagishi, et al., "The Applicability of CPP-GMR for Over 100Gbpsi", Intermag 2002, abstract, CA02.
Matsuzono, et al., "Study on requirements for shielded current perpendicular to the spin plane valve heads based on dynamic read tests", Journal of Applied Physics, vol. 91, No. 10, May 15, 2002, pp. 7267-7269.

* cited by examiner

*Primary Examiner*—Allen T Cao
(74) *Attorney, Agent, or Firm*—Virtual Law Partners, LLP

(57) ABSTRACT

A method and system for providing a current confined magnetic element is disclosed. The method and system include providing a pinned layer, providing a nonmagnetic spacer layer, and providing a free layer. The nonmagnetic spacer layer resides between the pinned layer and the free layer. The method and system also include sputtering a current confinement layer. The current confinement layer includes an insulator and a conductor that are immiscible. The conductor forms a plurality of nano-dots in an insulating matrix. At least a portion of the plurality of nano-dots extends through the current confinement layer.

14 Claims, 11 Drawing Sheets

METHOD AND SYSTEM FOR PROVIDING A MAGNETIC ELEMENT HAVING A CURRENT CONFINED LAYER

FIELD OF THE INVENTION

The present invention relates to magnetic recording technology, and more particularly to a method and system for providing a magnetic element having a current confined layer.

BACKGROUND OF THE INVENTION

In magnetic recording technology, the current trend is to higher density media. Such higher density media are achieved by utilizing a smaller track width. As a result, heads which can write to and read from such small track width, higher density media are of increasing interest. In particular, it would be desirable to obtain a magnetic element capable of being used in a read head for recording densities of greater than one hundred and fifty gigabytes per square inch.

FIG. 1 depicts a conventional magnetic element 10 that is of interest because it might be capable of reading such higher density media. The conventional magnetic element 10 is a conventional spin valve that includes a conventional current confinement layer (CCL) 60. The conventional magnetic element 10 also includes a conventional antiferromagnetic (AFM) layer 20, a conventional pinned layer 30, a conventional nonmagnetic spacer layer 40, a conventional free layer 50, and a conventional capping layer 70. In addition, seed layers (not shown) and lead layers (not shown) are typically also used.

The conventional magnetic element 10 shown utilizes PtMn for the AFM layer 20 and Cu for the conventional nonmagnetic spacer layer 40. The conventional pinned layer 30 is also synthetic, including conventional ferromagnetic layers 32 and 36 separated by the conventional spacer layer 34. The conventional ferromagnetic layers 32 and 36 are typically composed of materials such as CoFe, while the conventional spacer layer 34 is typically composed of Ru and has a thickness such that the conventional ferromagnetic layers 32 and 36 are antiferromagnetically aligned.

In order to use the conventional magnetic element 10 at higher densities, current is typically driven in a current perpendicular to plane (CPP) configuration. In the CPP configuration, current is driven vertically as shown in FIG. 1. In order to increase the conventional CCL 60 is incorporated into the conventional magnetic element 10. The conventional CCL 60 includes conventional conductive nano-dots 62 in an insulating matrix 64. At least some of the conventional nano-dots 62 (and all that are shown in FIG. 1) extend completely through the insulating matrix 64. In operation, current driven through the conventional magnetic element 10 in the CPP configuration is restricted to the conventional nano-dots 62 in the conventional CCL 60. In the remainder of the conventional magnetic element 10, therefore, current is weakly confined to the regions vertically aligned with the conventional nano-dots 62. Because the current is effectively confined to narrow regions within the conventional magnetic element 10, the signal is improved.

Although the conventional magnetic element 10 may function in principle, one of ordinary skill in the art will recognize that there are drawbacks to the conventional CCL 60. In particular, the conventional CCL 60 is typically formed by depositing a layer including metal, and then oxidizing the layer. The formation of the conventional nano-dots 62 is difficult to control in such a process. Consequently, as depicted in FIG. 1, the size and/or distribution of the conventional nano-dots 62 may be nonuniform. Furthermore, the thermal stability of such a conventional CCL is poor. For example, the size and distribution of the nano-dots 62 may vary widely after an anneal. Thus, in practice, the conventional magnetic element 10 may be difficult to incorporate into a reliable working device.

Accordingly, what is needed is a system and method for providing an improved magnetic element capable of being used at higher densities. The present invention addresses such a need.

SUMMARY OF THE INVENTION

The present invention provides a method and system for providing a current confined magnetic element. The method and system comprise providing a pinned layer, providing a nonmagnetic spacer layer, and providing a free layer. The nonmagnetic spacer layer resides between the pinned layer and the free layer. The method and system also comprise sputtering a current confinement layer. The current confinement layer includes an insulator and a conductor that are immiscible. The conductor forms a plurality of nano-dots in an insulating matrix. At least a portion of the plurality of nano-dots extends through the current confinement layer.

According to the system and method disclosed herein, the present invention provides a method for simply and repeatably providing a current confined magnetic element that has a uniform and stable current confined layer.

DETAILED DESCRIPTION OF THE INVENTION

The present invention relates to an improvement in magnetic recording technology. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a current confined magnetic element. The method and system comprise providing a pinned layer, providing a nonmagnetic spacer layer, and providing a free layer. The nonmagnetic spacer layer resides between the pinned layer and the free layer. The method and system also comprise sputtering a current confinement layer. The current confinement layer includes an insulator and a conductor that are immiscible. The conductor forms a plurality of nano-dots in an insulating matrix. At least a portion of the plurality of nano-dots extends through the current confinement layer.

The present invention will be described in terms of a particular magnetic element including certain layers. However, one of ordinary skill in the art will readily recognize that this method and system will operate effectively for other magnetic element having other and/or additional layers. The present invention is also described in terms of certain layers being synthetic or simple and in the context of a bottom spin valve. However, one of ordinary skill in the art will readily recognize that synthetic layers may be substituted for certain simple layers and vice versa. One of ordinary skill in the art will also readily recognize that a top spin valve or other analogous structures could be used. The present invention is also described in the context of particular locations of the current confinement layer. However, one of ordinary skill in the art will readily recognize that the current confinement layer might be located elsewhere. Finally, the present invention is described in the context of a CPP magnetic element. However, one of ordinary skill in the art will readily recognize that in certain applications current may be driven in another direction.

Figure 1:
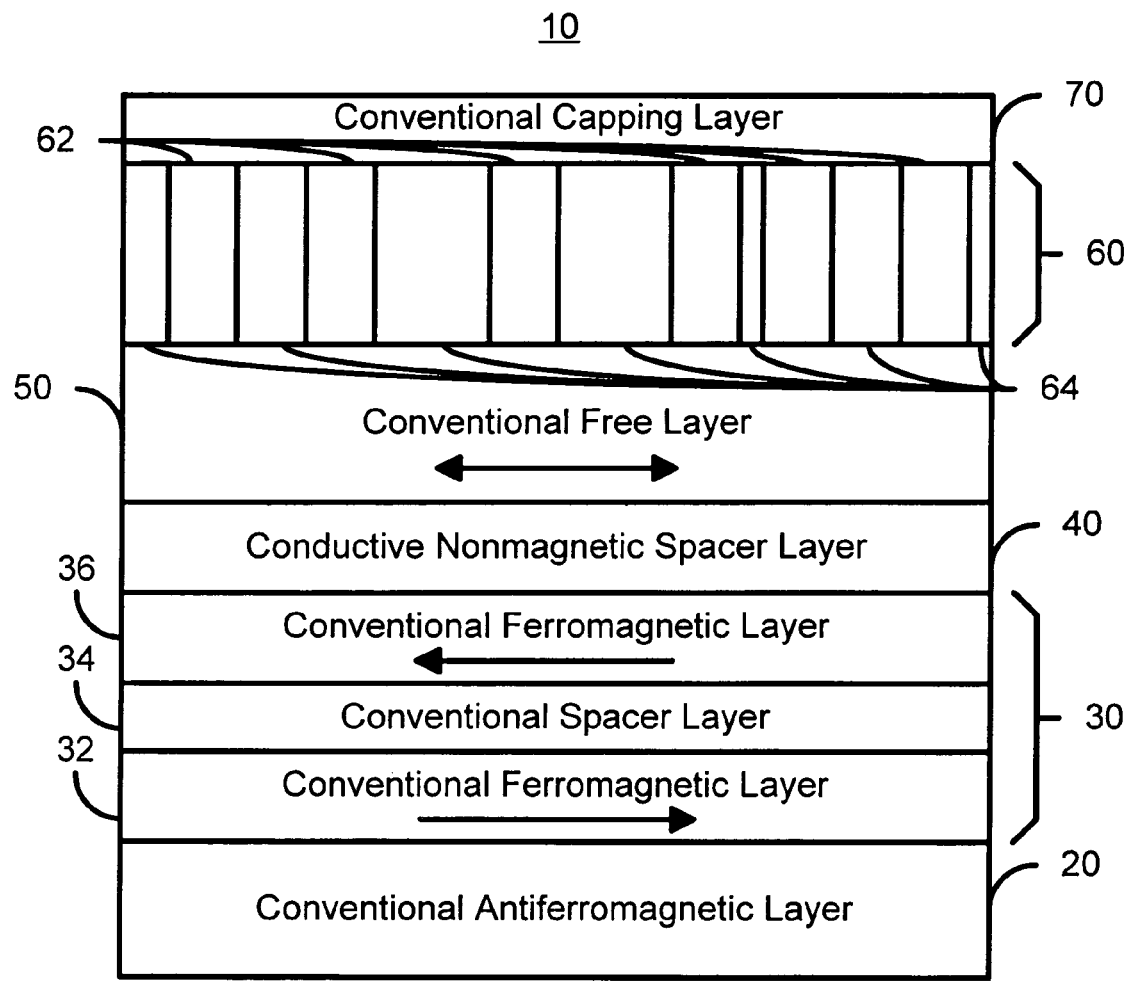
FIG. 1 is a diagram of a conventional magnetic element containing a current confinement layer.
Figure 2:
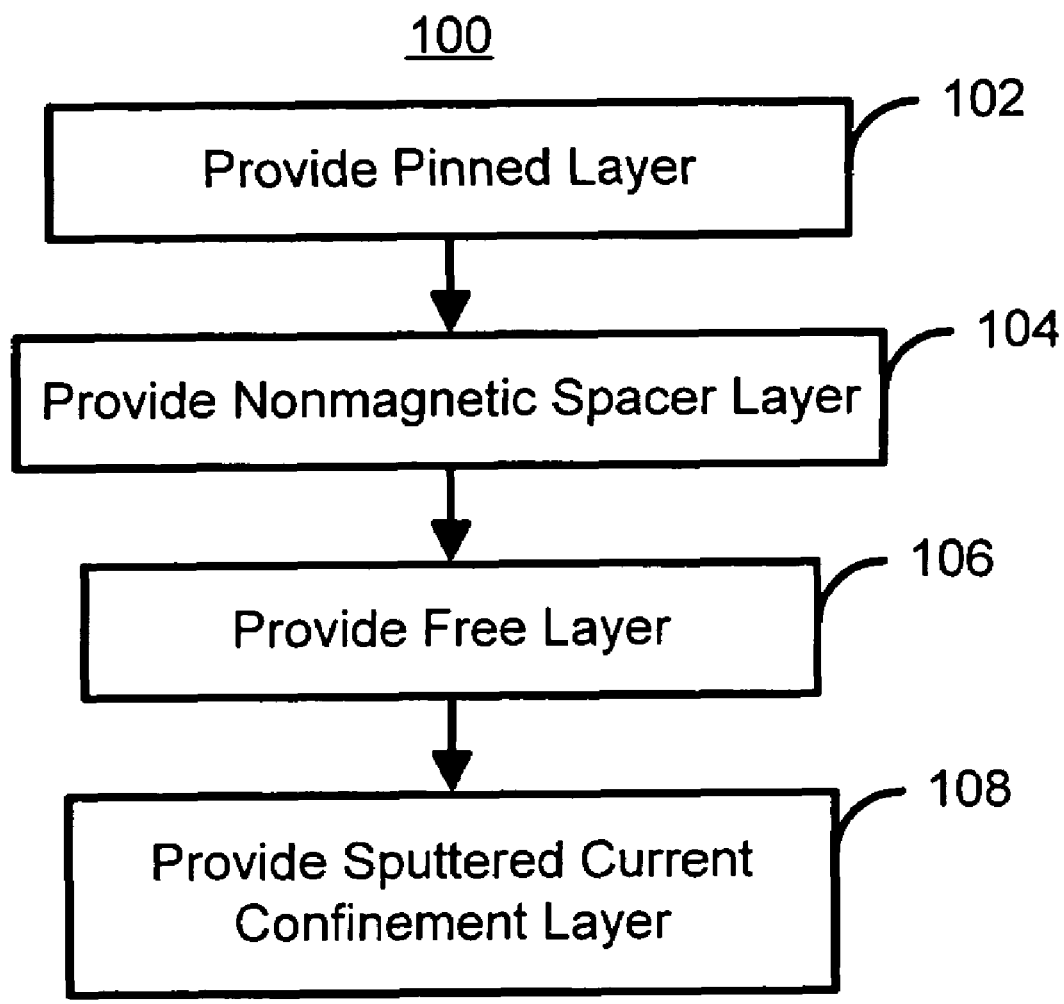
FIG. 2 is a high-level flow chart depicting one embodiment of a method for providing a magnetic element containing a sputtered current confinement layer in accordance with the present invention.

To more particularly illustrate the method and system in accordance with the present invention, refer now to FIG. 2, depicting a high-level flow chart of one embodiment of a method 100 for providing a magnetic element containing a sputtered current confinement layer in accordance with the present invention. A pinned layer is provided, via step 102. Step 102 preferably includes providing a synthetic pinned layer including two ferromagnetic layers separated by a conductive, nonmagnetic spacer layer. However, a simple pinned layer could also be provided in step 102. A nonmagnetic spacer layer is provided in step 104. The nonmagnetic spacer layer provided in step 102 is preferably conductive and composed of Cu. A free layer is provided, via step 106. The free layer provided in step 106 is preferably a simple free layer. In an alternate embodiment, the free layer could be a synthetic free layer including two ferromagnetic layers separated by a conductive, nonmagnetic spacer layer, such as Ru. Steps 102, 104, and 106 are carried out such that the nonmagnetic spacer layer resides between the free layer and the pinned layer.

A sputtered current confinement layer (CCL) containing conductive nano-dots in an insulating matrix is provided, via step 108. Step 108 includes sputtering an immiscible conductor and insulator. For example, Ni and $Al_2O_3$ could be used. In one embodiment, step 108 includes co-sputtering the conductor and insulator. A composite target including both the conductor and the insulator, for example an $Al_2O_3$/Ni composite target, might be used. Alternatively, the conductor and insulator could be sputtered from separate targets. Furthermore, RF sputtering may be used, particularly for the composite and insulator targets. The ratio of conductor to insulator determines the distribution of the nano-dots for the CCL. In general, the higher the ratio of conductor to insulator, the closer the nano-dots. In another embodiment, thin layers of conductor and thicker layers of the insulator may be alternatively deposited in step 108. In such an embodiment, step 108 may also include an anneal to ensure that the conductive nano-dots are well defined in the insulating matrix.

Using the method 100, and particularly step 108, a CCL can be provided in a magnetic element. Because the CCL is sputtered, well-known techniques can be used to provide an improved magnetic element. Furthermore, sputtering allows for a more uniform distribution of nano-dots, as well as a more uniform nano-dot size. For example, one experiment produced a film having nano-dots approximately three nanometers in diameter having an interval of approximately six nanometers. Because the size and distribution of nano-dots are uniform, the current passing through the CCL is more uniform, which is desirable for a variety of reasons. Moreover, as discussed above, the density of the nano-dots can be relatively easily controlled by controlling the ratio of conductor to insulator. For example, the composition of a composite target, the sputtering rates of separate targets, or the thicknesses of separate layer and the associated anneal times and temperatures could be tailored to achieve the desired nano-dot density. Further, the thermal stability of the CCL is improved. For example, in one experiment, a ten hour anneal at two hundred and seventy degrees Celsius was performed on a film having the nano-dots size and distribution described above. The resulting film maintained well defined nano-dots and a uniform distribution. Consequently, a device formed using the magnetic element formed using the method 100 has improved stability and reliability.

Figure 3A:
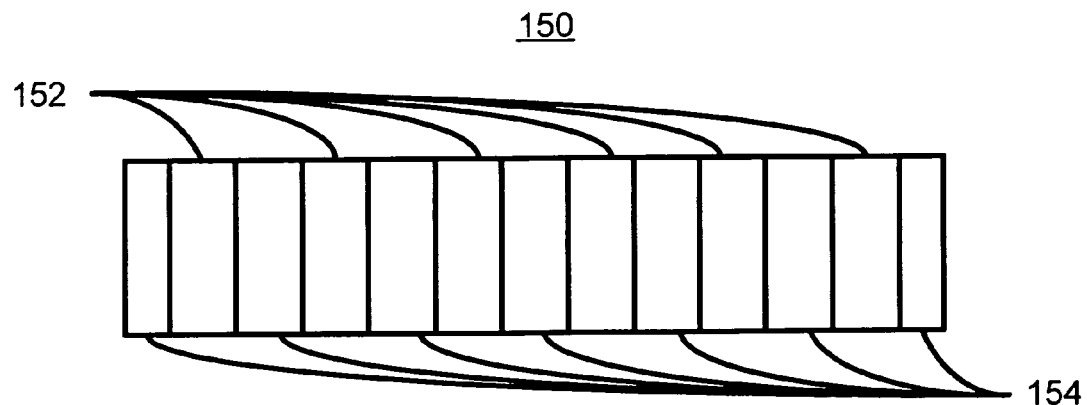
FIG. 3A is a diagram depicting a side view of one embodiment of a sputtered current confinement layer in accordance with the present invention.
Figure 3B:
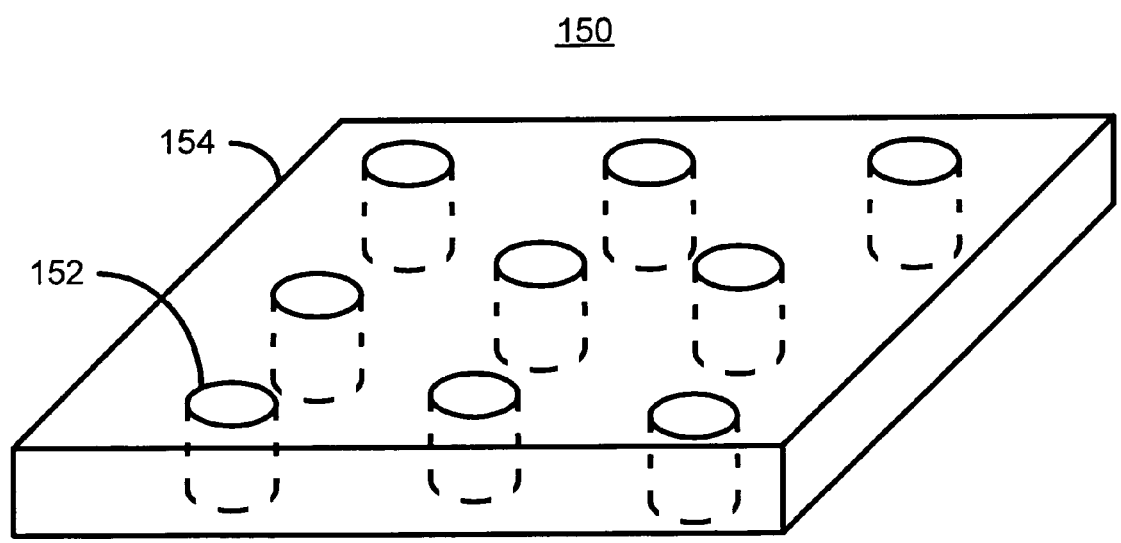
FIG. 3B is a diagram depicting a perspective view of one embodiment of a sputtered current confinement layer in accordance with the present invention.

FIGS. 3A and 3B depict one embodiment of a CCL 150 formed in accordance with the present invention. FIG. 3A depicts a side view of the CCL 150, while FIG. 3B is a perspective view of the CCL 150. The CCL 150 is sputtered and includes nano-dots 152 in an insulating matrix 154. Note that in FIG. 3B only one of the nano-dots is actually labeled. As can be seen in FIGS. 3A and 3B the nano-dots 152 are of substantially uniform size and distribution, which is desirable. In addition, a significant portion of the nano-dots 152 (all those depicted in FIGS. 3A and 3B) extend through the CCL 150. Thus, the nano-dots 152 are capable of carrying current driven in a CPP configuration (vertically in FIGS. 3A and 3B) through the CCL 150. Moreover, such a current would be substantially confined to those regions direction above and below the nano-dots 152. Furthermore, because the CCL 150 is formed by sputtering, the CCL 150 should be thermally stable. Consequently, a magnetic element having an improved signal, improved thermal stability and reliability, and simplified fabrication could be provided using the CCL 150.

Figure 4A:
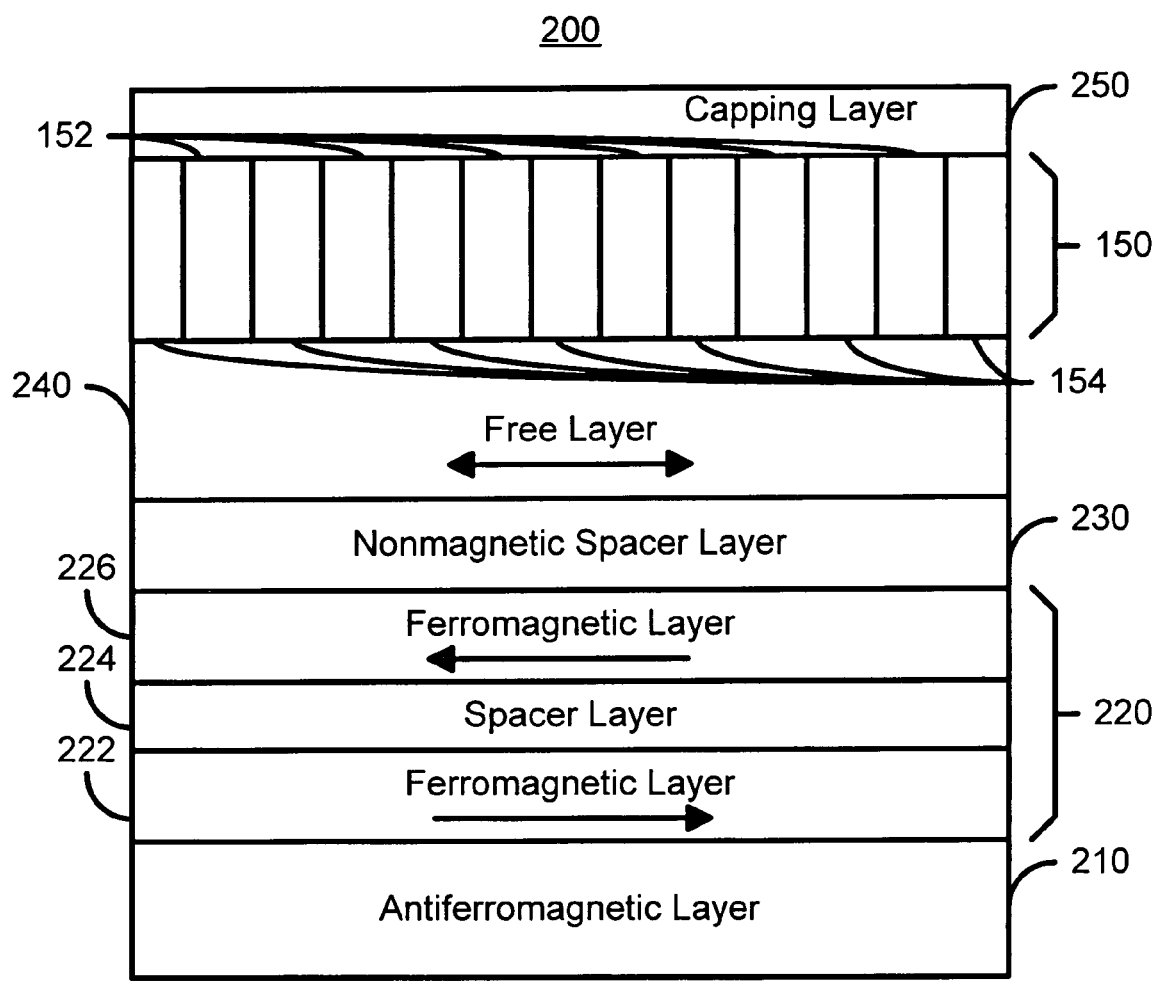
FIG. 4A is a diagram of a first embodiment of a magnetic element containing a sputtered current confinement layer in accordance with the present invention.

FIGS. 4A-4H depict embodiments of magnetic elements incorporating embodiments of the CCL 150 that is formed by sputtering. FIG. 4A is a diagram of a first embodiment of a magnetic element 200 containing a sputtered CCL 150 in accordance with the present invention. The magnetic element 200 includes an AFM layer 210, a pinned layer 220, a nonmagnetic spacer layer 230, a free layer 240, the CCL 150 and an optional capping layer 250. In addition, seed layers (not shown) and lead layers (not shown) are generally also used. For a CPP configuration, the leads would be at the top, above the capping layer 250 and the bottom, below the AFM layer 210 and any seed layers.

In the embodiment shown, the synthetic pinned layer 220 includes ferromagnetic layers 222 and 226 separated by a conductive, nonmagnetic spacer layer 224. However, in an alternate embodiment, a simple pinned layer 220 could also be used. The ferromagnetic layers 222 and 226 are preferably CoFe, while the spacer layer 224 is preferably Ru. The spacer layer 224 is configured to ensure that the ferromagnetic layers 222 and 226 are antiferromagnetically coupled. The AFM layer 210 is used to pin the magnetization of the ferromagnetic layer 222 and preferably includes PtMn. The free layer 240 depicted is a simple free layer. However, in an alternate embodiment, a synthetic free layer could be used.

The CCL 150 is sputtered and includes conductive nano-dots 152 in the insulating matrix 154. In the magnetic element 200, the CCL 150 resides on the free layer 240. Because of the use of the CCL 150, current driven in the CPP direction is weakly confined to the regions directly above and below the nano-dots 152. As a result, the magnetic element 200 may have a sufficiently high signal to be used in high density recording applications, particularly above one hundred and fifty gigabytes per square inch. Moreover, because the CCL 150 is sputtered, the nano-dots have a well defined, uniform size and a uniform distribution. Furthermore, thermal stability of the CCL 150 is improved. As a result, the magnetic element 200 has improved thermal stability and reliability. Moreover, because the CCL 150 is sputtered, the distribution of the nano-dots is controllable and the CCL 150 is relatively simple to form. Consequently, the magnetic element 200 is simpler to fabricate and can be more easily tailored.

Figure 4B:
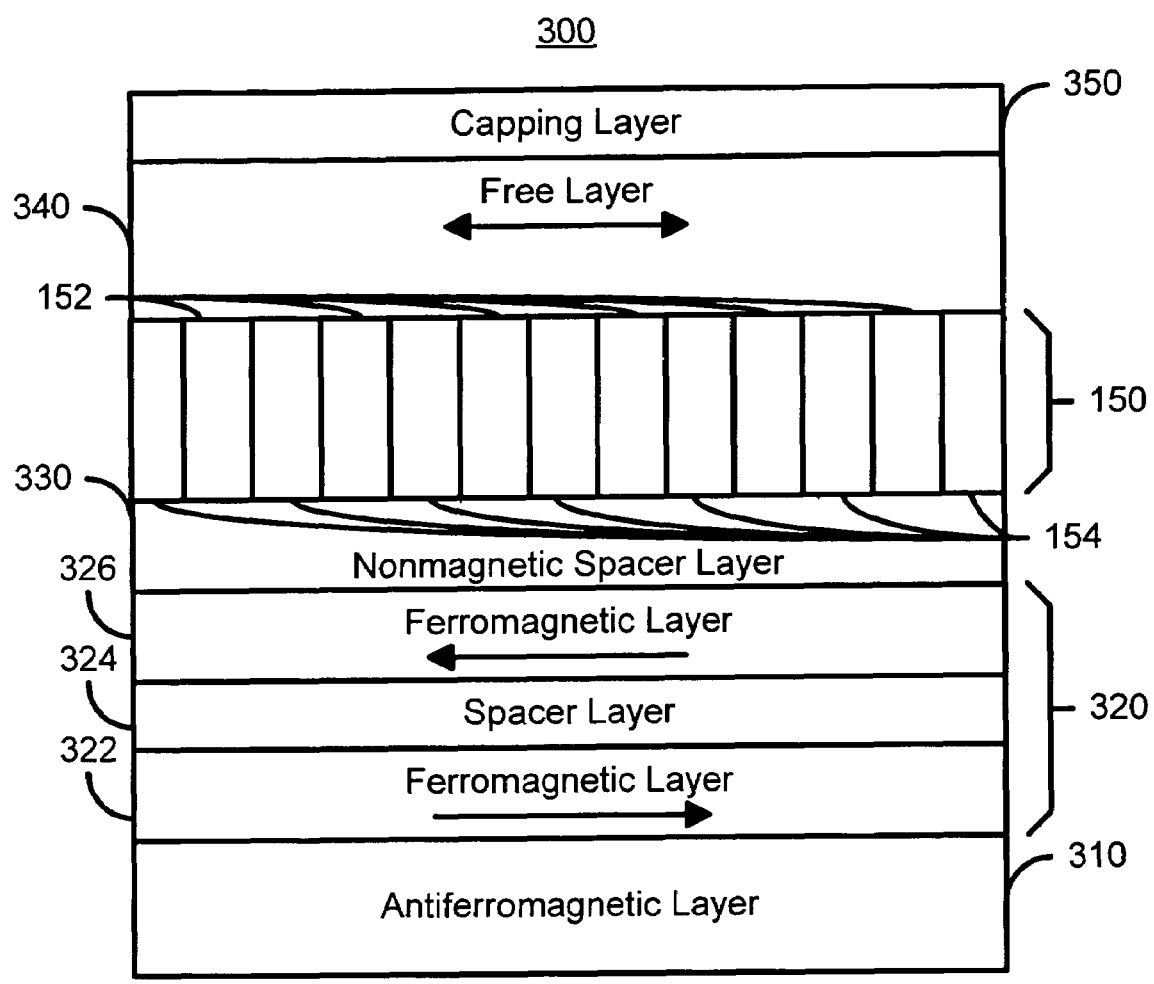
FIG. 4B is a diagram of a second embodiment of a magnetic element containing a sputtered current confinement layer in accordance with the present invention.

FIG. 4B is a diagram of a second embodiment of a magnetic element 300 containing a sputtered CCL in accordance with the present invention. The magnetic element 300 includes an AFM layer 310, a pinned layer 320, a nonmagnetic spacer layer 230, a free layer 340, the CCL 150 and an optional capping layer 350. In addition, seed layers (not shown) and lead layers (not shown) are generally also used. For a CPP configuration, the leads would be at the top, above the capping layer 350 and the bottom, below the AFM layer 310 and any seed layers.

In the embodiment shown, the synthetic pinned layer 320 includes ferromagnetic layers 322 and 326 separated by a conductive, nonmagnetic spacer layer 324. However, in an alternate embodiment, a simple pinned layer 320 could also be used. The ferromagnetic layers 322 and 326 are preferably CoFe, while the spacer layer 324 is preferably Ru. The spacer layer 324 is configured to ensure that the ferromagnetic layers 322 and 326 are antiferromagnetically coupled. The AFM layer 310 is used to pin the magnetization of the ferromagnetic layer 322 and preferably includes PtMn. The free layer 340 depicted is a simple free layer. However, in an alternate embodiment, a synthetic free layer could be used.

The CCL 150 is sputtered and includes conductive nano-dots 152 in the insulating matrix 154. In the magnetic element 300, the CCL 150 resides between the free layer 340 and the nonmagnetic spacer layer 330. Because of the use of the CCL 150, current driven in the CPP direction is weakly confined to the regions directly above and below the nano-dots 152. As a result, the magnetic element 300 may have a sufficiently high signal to be used in high density recording applications, particularly above one hundred and fifty gigabytes per square inch. Moreover, because the CCL 150 is sputtered, the nano-dots have a well defined, uniform size and a uniform distribution. Furthermore, thermal stability of the CCL 150 is improved. As a result, the magnetic element 300 has improved thermal stability and reliability. Moreover, because the CCL 150 is sputtered, the distribution of the nano-dots is controllable and the CCL 150 is relatively simple to form. Consequently, the magnetic element 300 is simpler to fabricate and can be more easily tailored.

Figure 4C:
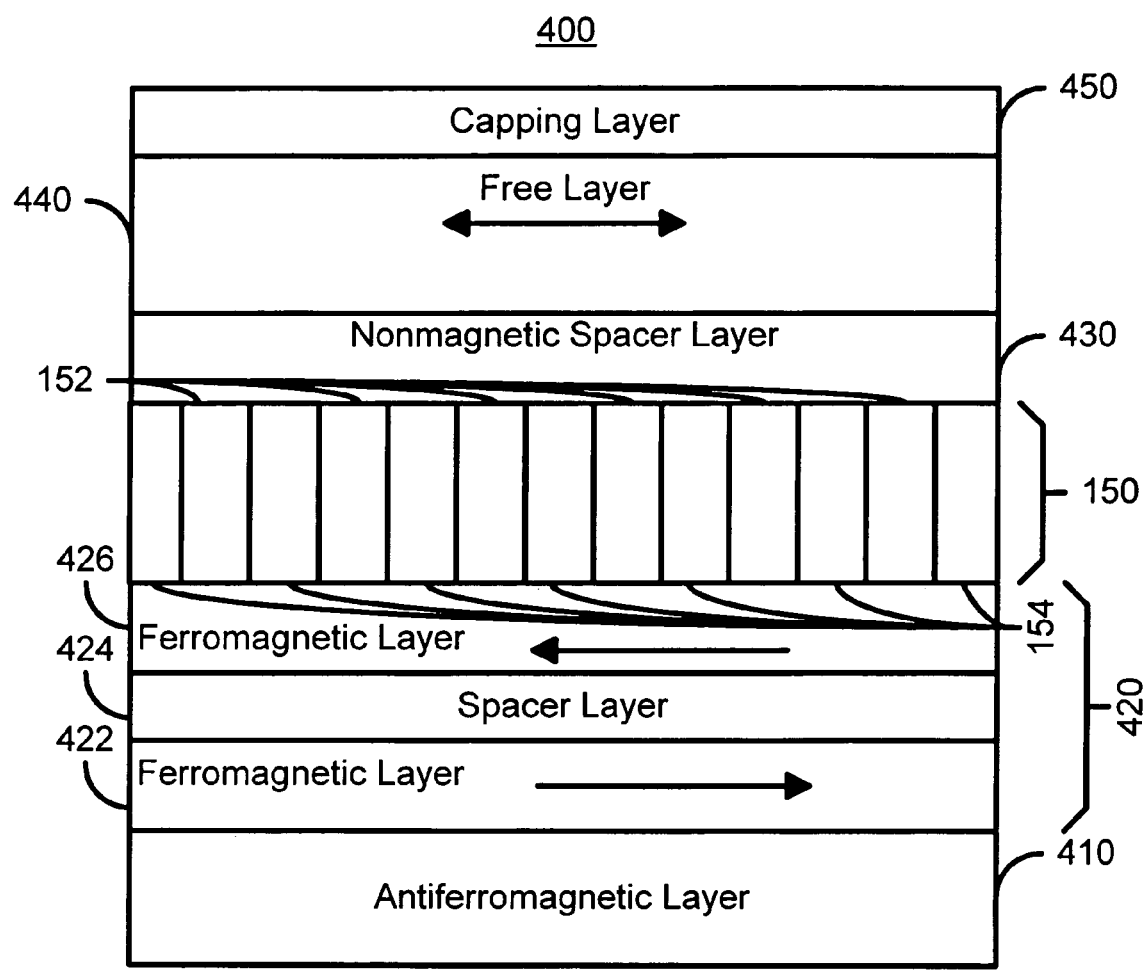
FIG. 4C is a diagram of a third embodiment of a magnetic element containing a sputtered current confinement layer in accordance with the present invention.

FIG. 4C is a diagram of a third embodiment of a magnetic element 400 containing a sputtered CCL 150 in accordance with the present invention. The magnetic element 400 includes an AFM layer 410, a pinned layer 420, a nonmagnetic spacer layer 430, a free layer 440, the CCL 150 and an optional capping layer 450. In addition, seed layers (not shown) and lead layers (not shown) are generally also used. For a CPP configuration, the leads would be at the top, above the capping layer 450 and the bottom, below the AFM layer 410 and any seed layers.

In the embodiment shown, the synthetic pinned layer 420 includes ferromagnetic layers 422 and 426 separated by a conductive, nonmagnetic spacer layer 424. However, in an alternate embodiment, a simple pinned layer 420 could also be used. The ferromagnetic layers 422 and 426 are preferably CoFe, while the spacer layer 424 is preferably Ru. The spacer layer 424 is configured to ensure that the ferromagnetic layers 422 and 426 are antiferromagnetically coupled. The AFM layer 410 is used to pin the magnetization of the ferromagnetic layer 422 and preferably includes PtMn. The free layer 440 depicted is a simple free layer. However, in an alternate embodiment, a synthetic free layer could be used.

The CCL 150 is sputtered and includes conductive nano-dots 152 in the insulating matrix 154. In the magnetic element 400, the CCL 150 resides between the nonmagnetic spacer layer 430 and the pinned layer 420. Because of the use of the CCL 150, current driven in the CPP direction is weakly confined to the regions directly above and below the nano-dots 152. As a result, the magnetic element 400 may have a sufficiently high signal to be used in high density recording applications, particularly above one hundred and fifty gigabytes per square inch. Moreover, because the CCL 150 is sputtered, the nano-dots have a well defined, uniform size and a uniform distribution. Furthermore, thermal stability of the CCL 150 is improved. As a result, the magnetic element 400 has improved thermal stability and reliability. Moreover, because the CCL 150 is sputtered, the distribution of the nano-dots is controllable and the CCL 150 is relatively simple to form. Consequently, the magnetic element 400 is simpler to fabricate and can be more easily tailored.

Figure 4D:
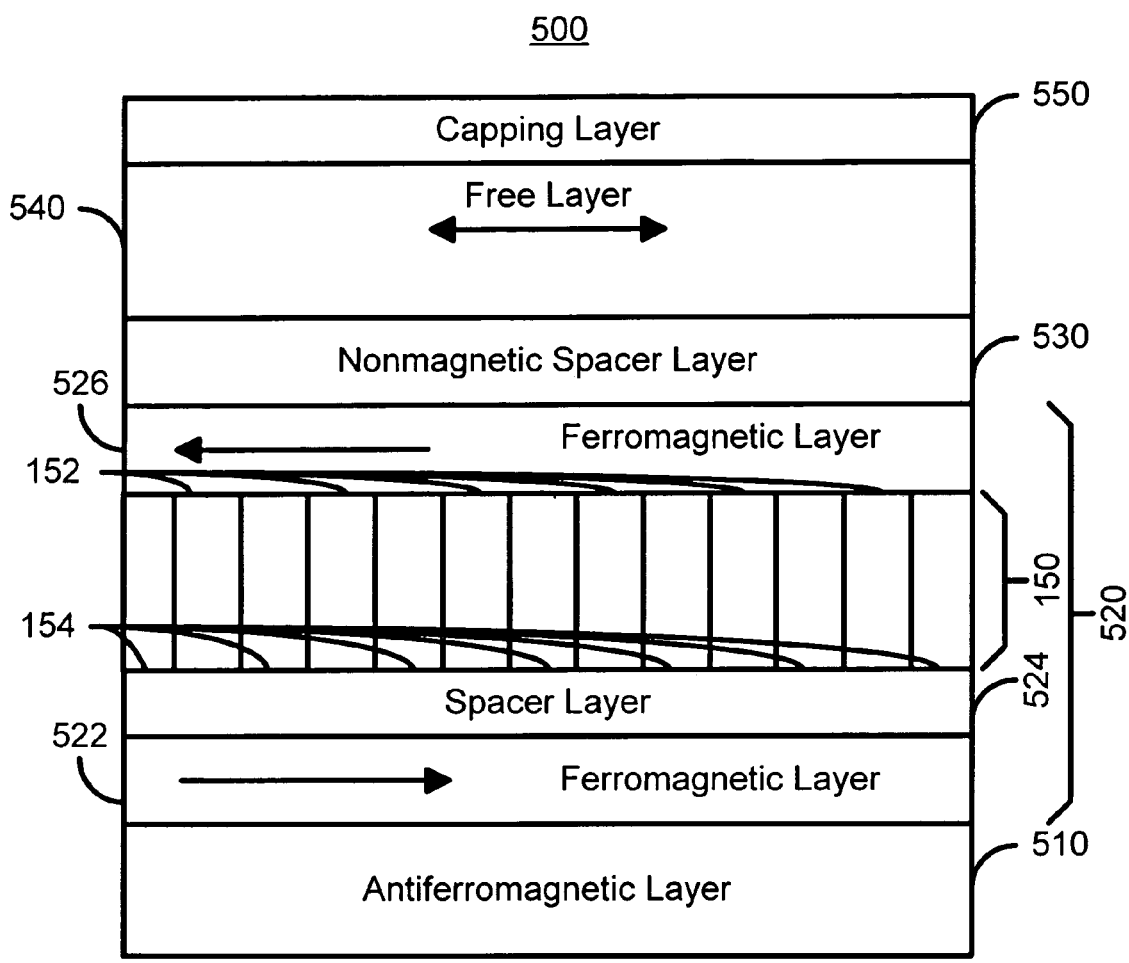
FIG. 4D is a diagram of a fourth embodiment of a magnetic element containing a sputtered current confinement layer in accordance with the present invention.

FIG. 4D is a diagram of a fourth embodiment of a magnetic element 500 containing a sputtered CCL 150 in accordance with the present invention. The magnetic element 500 includes an AFM layer 510, a pinned layer 520, a nonmagnetic spacer layer 530, a free layer 540, the CCL 150 and an optional capping layer 550. In addition, seed layers (not shown) and lead layers (not shown) are generally also used. For a CPP configuration, the leads would be at the top, above the capping layer 550 and the bottom, below the AFM layer 510 and any seed layers.

In the embodiment shown, the synthetic pinned layer 520 includes ferromagnetic layers 522 and 526 separated by a conductive, nonmagnetic spacer layer 524. However, in an alternate embodiment, a simple pinned layer 520 could also be used. The ferromagnetic layers 522 and 526 are preferably CoFe, while the spacer layer 524 is preferably Ru. The spacer layer 524 is configured to ensure that the ferromagnetic layers 522 and 526 are antiferromagnetically coupled. The AFM layer 510 is used to pin the magnetization of the ferromagnetic layer 522 and preferably includes PtMn. The free layer 540 depicted is a simple free layer. However, in an alternate embodiment, a synthetic free layer could be used.

The CCL 150 is sputtered and includes conductive nano-dots 152 in the insulating matrix 154. In the magnetic element 500, the CCL 150 resides in the pinned layer 520. More specifically, in the embodiment shown, the CCL 150 resides between the ferromagnetic layer 526 and the spacer layer 524. Because of the use of the CCL 150, current driven in the CPP direction is weakly confined to the regions directly above and below the nano-dots 152. As a result, the magnetic element 500 may have a sufficiently high signal to be used in high density recording applications, particularly above one hundred and fifty gigabytes per square inch. Moreover, because the CCL 150 is sputtered, the nano-dots have a well defined, uniform size and a uniform distribution. Furthermore, thermal stability of the CCL 150 is improved. As a result, the magnetic element 500 has improved thermal stability and reliability. Moreover, because the CCL 150 is sputtered, the distribution of the nano-dots is controllable and the CCL 150 is relatively simple to form. Consequently, the magnetic element 500 is simpler to fabricate and can be more easily tailored.

Figure 4E:
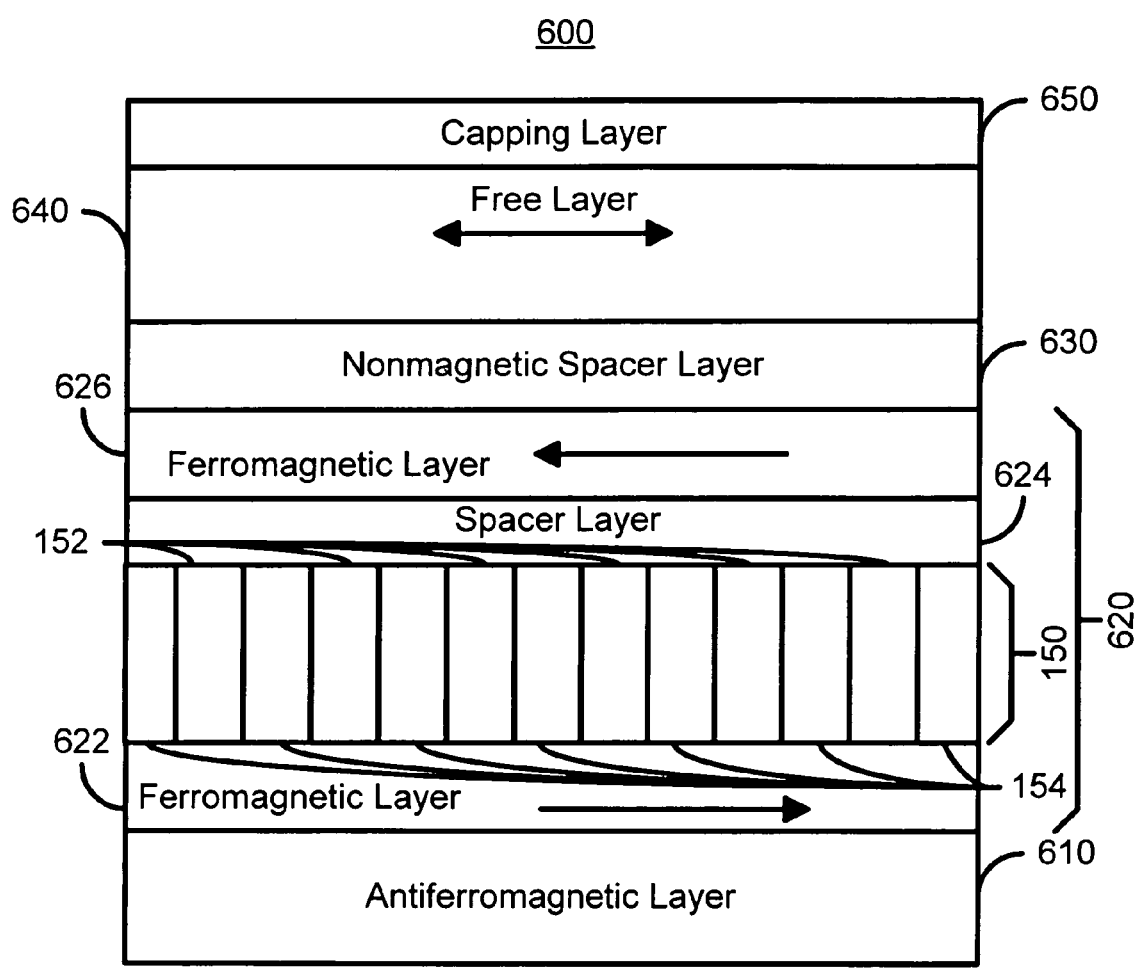
FIG. 4E is a diagram of a fifth embodiment of a magnetic element containing a sputtered current confinement layer in accordance with the present invention.

FIG. 4E is a diagram of a fifth embodiment of a magnetic element 600 containing a sputtered CCL in accordance with the present invention. The magnetic element 600 includes an AFM layer 610, a pinned layer 620, a nonmagnetic spacer layer 630, a free layer 640, the CCL 150 and an optional capping layer 650. In addition, seed layers (not shown) and lead layers (not shown) are generally also used. For a CPP configuration, the leads would be at the top, above the capping layer 650 and the bottom, below the AFM layer 610 and any seed layers.

In the embodiment shown, the synthetic pinned layer 620 includes ferromagnetic layers 622 and 626 separated by a conductive, nonmagnetic spacer layer 624. However, in an alternate embodiment, a simple pinned layer 620 could also be used. The ferromagnetic layers 622 and 626 are preferably CoFe, while the spacer layer 624 is preferably Ru. The spacer layer 624 is configured to ensure that the ferromagnetic layers 622 and 626 are antiferromagnetically coupled. The AFM layer 610 is used to pin the magnetization of the ferromagnetic layer 622 and preferably includes PtMn. The free layer 640 depicted is a simple free layer. However, in an alternate embodiment, a synthetic free layer could be used.

The CCL 150 is sputtered and includes conductive nano-dots 152 in the insulating matrix 154. In the magnetic element 600, the CCL 150 resides within the pinned layer 620. More specifically, in the embodiment shown, the CCL 150 resides between the spacer layer 624 and the ferromagnetic layer 622. Because of the use of the CCL 150, current driven in the CPP direction is weakly confined to the regions directly above and below the nano-dots 152. As a result, the magnetic element 600 may have a sufficiently high signal to be used in high density recording applications, particularly above one hundred and fifty gigabytes per square inch. Moreover, because the CCL 150 is sputtered, the nano-dots have a well defined, uniform size and a uniform distribution. Furthermore, thermal stability of the CCL 150 is improved. As a result, the magnetic element 600 has improved thermal stability and reliability. Moreover, because the CCL 150 is sputtered, the distribution of the nano-dots is controllable and the CCL 150 is relatively simple to form. Consequently, the magnetic element 600 is simpler to fabricate and can be more easily tailored.

Figure 4F:
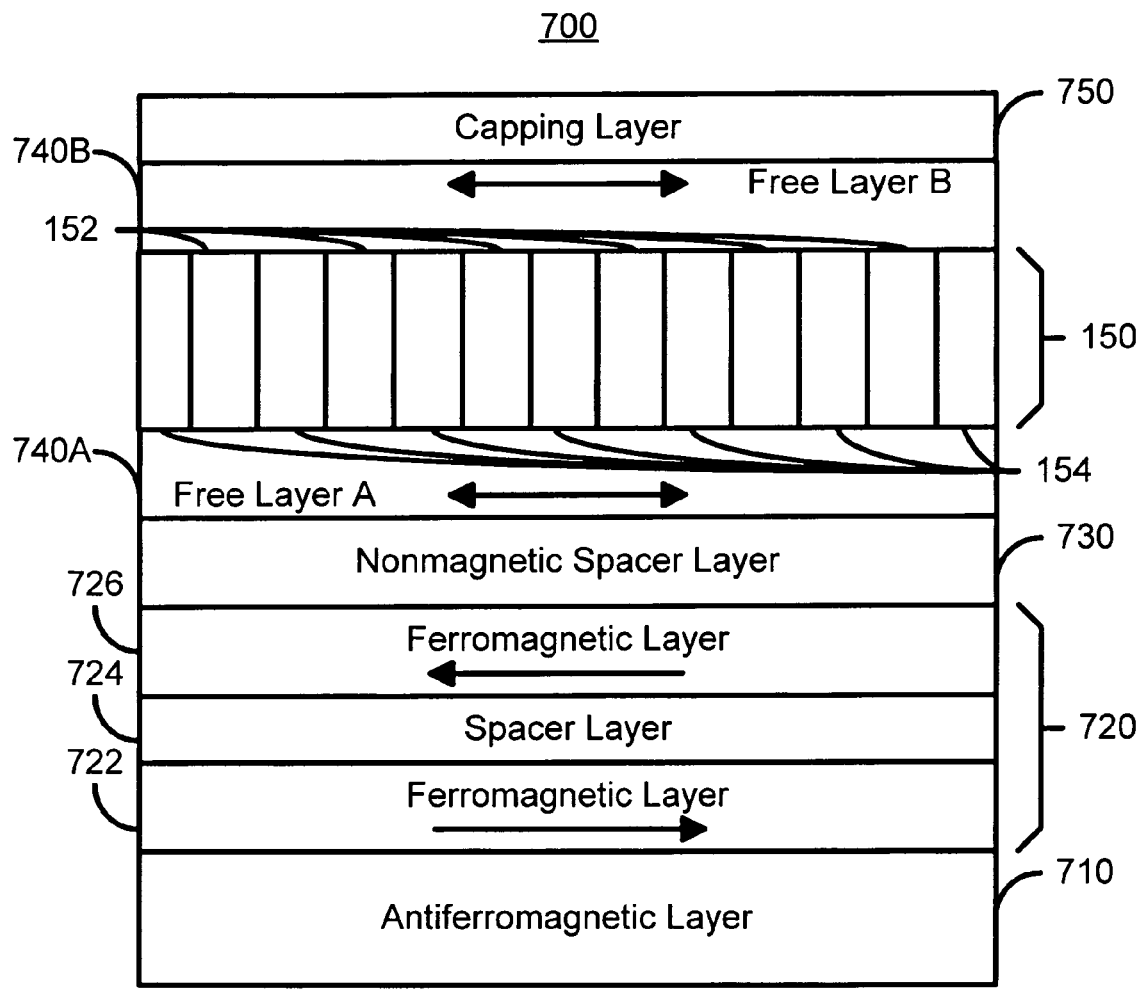
FIG. 4F is a diagram of a sixth embodiment of a magnetic element containing a sputtered current confinement layer in accordance with the present invention.

FIG. 4F is a diagram of a sixth embodiment of a magnetic element 700 containing a sputtered CCL 150 in accordance with the present invention. The magnetic element 700 includes an AFM layer 710, a pinned layer 720, a nonmagnetic spacer layer 730, a free layer 740, the CCL 150 and an optional capping layer 750. In addition, seed layers (not shown) and lead layers (not shown) are generally also used. For a CPP configuration, the leads would be at the top, above the capping layer 750 and the bottom, below the AFM layer 710 and any seed layers. In addition, because the CCL 150 resides within the free layer 740, the free layer is depicted as including two ferromagnetic layers, free layer A 740A and free layer B 740B.

In the embodiment shown, the synthetic pinned layer 720 includes ferromagnetic layers 722 and 726 separated by a conductive, nonmagnetic spacer layer 724. However, in an alternate embodiment, a simple pinned layer 720 could also be used. The ferromagnetic layers 722 and 726 are preferably CoFe, while the spacer layer 724 is preferably Ru. The spacer layer 724 is configured to ensure that the ferromagnetic layers 722 and 726 are antiferromagnetically coupled. The AFM layer 710 is used to pin the magnetization of the ferromagnetic layer 722 and preferably includes PtMn. The free layer 740 depicted is a simple free layer. However, in an alternate embodiment, a synthetic free layer could be used.

The CCL 150 is sputtered and includes conductive nano-dots 152 in the insulating matrix 154. In the magnetic element 700, the CCL 150 resides within the free layer 740. Because of the use of the CCL 150, current driven in the CPP direction is weakly confined to the regions directly above and below the nano-dots 152. As a result, the magnetic element 700 may have a sufficiently high signal to be used in high density recording applications, particularly above one hundred and fifty gigabytes per square inch. Moreover, because the CCL 150 is sputtered, the nano-dots have a well defined, uniform size and a uniform distribution. Furthermore, thermal stability of the CCL 150 is improved. As a result, the magnetic element 700 has improved thermal stability and reliability. Moreover, because the CCL 150 is sputtered, the distribution of the nano-dots is controllable and the CCL 150 is relatively simple to form. Consequently, the magnetic element 700 is simpler to fabricate and can be more easily tailored.

Figure 4G:
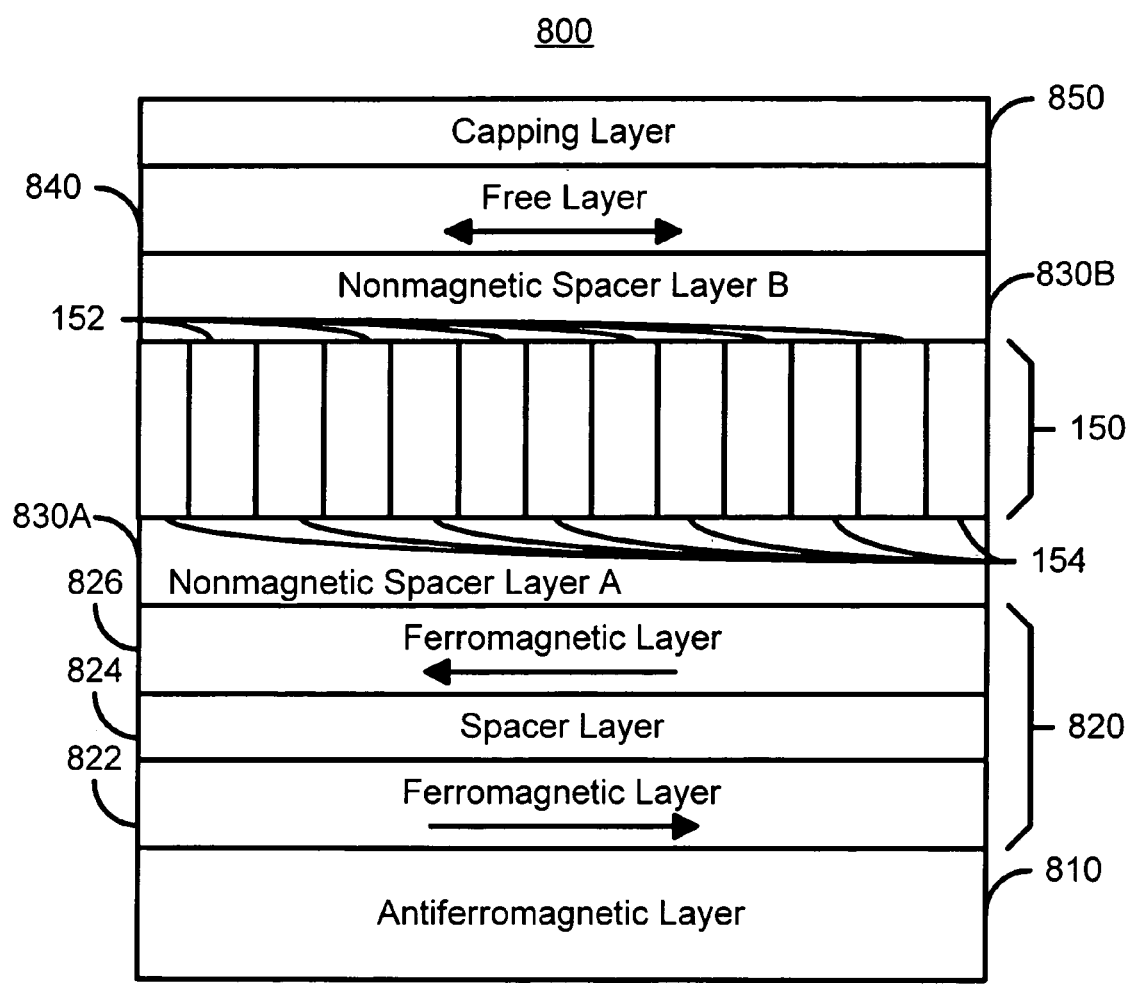
FIG. 4G is a diagram of a seventh embodiment of a magnetic element containing a sputtered current confinement layer in accordance with the present invention.

FIG. 4G is a diagram of a seventh embodiment of a magnetic element 800 containing a sputtered CCL 150 in accordance with the present invention. The magnetic element 800 includes an AFM layer 810, a pinned layer 820, a nonmagnetic spacer layer 830, a free layer 840, the CCL 150 and an optional capping layer 850. In addition, seed layers (not shown) and lead layers (not shown) are generally also used. For a CPP configuration, the leads would be at the top, above the capping layer 850 and the bottom, below the AFM layer 810 and any seed layers. The CCL 150 resides within the nonmagnetic spacer layer 830. Consequently, the nonmagnetic spacer layer 830 is shown as including the nonmagnetic spacer layer A 830A and the nonmagnetic spacer layer B 830B.

In the embodiment shown, the synthetic pinned layer 820 includes ferromagnetic layers 822 and 826 separated by a conductive, nonmagnetic spacer layer 824. However, in an alternate embodiment, a simple pinned layer 820 could also be used. The ferromagnetic layers 822 and 826 are preferably CoFe, while the spacer layer 824 is preferably Ru. The spacer layer 824 is configured to ensure that the ferromagnetic layers 822 and 826 are antiferromagnetically coupled. The AFM layer 810 is used to pin the magnetization of the ferromagnetic layer 822 and preferably includes PtMn. The free layer 840 depicted is a simple free layer. However, in an alternate embodiment, a synthetic free layer could be used.

The CCL 150 is sputtered and includes conductive nano-dots 152 in the insulating matrix 154. In the magnetic element 800, the CCL 150 resides within the nonmagnetic spacer layer 840. Because of the use of the CCL 150, current driven in the CPP direction is weakly confined to the regions directly above and below the nano-dots 152. As a result, the magnetic element 800 may have a sufficiently high signal to be used in high density recording applications, particularly above one hundred and fifty gigabytes per square inch. Moreover, because the CCL 150 is sputtered, the nano-dots have a well defined, uniform size and a uniform distribution. Furthermore, thermal stability of the CCL 150 is improved. As a result, the magnetic element 800 has improved thermal stability and reliability. Moreover, because the CCL 150 is sputtered, the distribution of the nano-dots is controllable and the CCL 150 is relatively simple to form. Consequently, the magnetic element 800 is simpler to fabricate and can be more easily tailored.

Figure 4H:
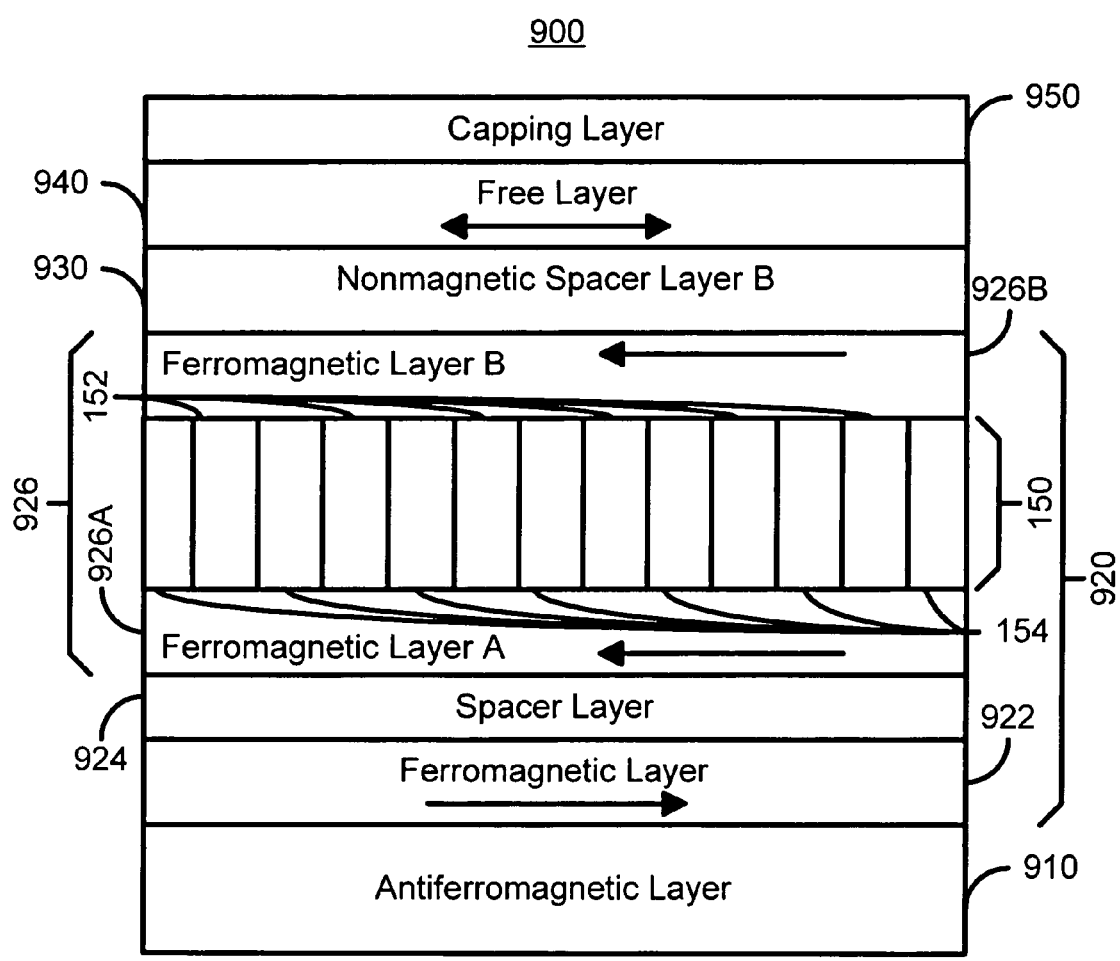
FIG. 4H is a diagram of an eighth embodiment of a magnetic element containing a sputtered current confinement layer in accordance with the present invention.

FIG. 4H is a diagram of an eighth embodiment of a magnetic element 900 containing a sputtered CCL 150 in accordance with the present invention. The magnetic element 900 includes an AFM layer 910, a pinned layer 920, a nonmagnetic spacer layer 930, a free layer 940, the CCL 150 and an optional capping layer 950. In addition, seed layers (not shown) and lead layers (not shown) are generally also used. For a CPP configuration, the leads would be at the top, above the capping layer 950 and the bottom, below the AFM layer 910 and any seed layers.

In the embodiment shown, the synthetic pinned layer 920 includes ferromagnetic layers 922 and 926 separated by a conductive, nonmagnetic spacer layer 924. However, in an alternate embodiment, a simple pinned layer 920 could also be used. The ferromagnetic layers 922 and 926 are preferably CoFe, while the spacer layer 924 is preferably Ru. The spacer layer 924 is configured to ensure that the ferromagnetic layers 922 and 926 are antiferromagnetically coupled. The CCL 150 is within the pinned layer 920. More specifically, the CCL 150 is located within the ferromagnetic layer 926 of the pinned layer 920. Consequently, the ferromagnetic layer 926 is depicted as including two parts, ferromagnetic layer A 926A and ferromagnetic layer B 926B. The AFM layer 910 is used to pin the magnetization of the ferromagnetic layer 922 and preferably includes PtMn. The free layer 940 depicted is a simple free layer. However, in an alternate embodiment, a synthetic free layer could be used.

The CCL 150 is sputtered and includes conductive nano-dots 152 in the insulating matrix 154. In the magnetic element 900, the CCL 150 resides within the ferromagnetic layer 926. Because of the use of the CCL 150, current driven in the CPP direction is weakly confined to the regions directly above and below the nano-dots 152. As a result, the magnetic element 900 may have a sufficiently high signal to be used in high density recording applications, particularly above one hundred and fifty gigabytes per square inch. Moreover, because the CCL 150 is sputtered, the nano-dots have a well defined, uniform size and a uniform distribution. Furthermore, thermal stability of the CCL 150 is improved. As a result, the magnetic element 900 has improved thermal stability and reliability. Moreover, because the CCL 150 is sputtered, the distribution of the nano-dots is controllable and the CCL 150 is relatively simple to form. Consequently, the magnetic element 200 is simpler to fabricate and can be more easily tailored.

A method and system has been disclosed for providing an improved current confined layer, particularly for use in a magnetic element. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a current confined magnetic element comprising:
   providing a pinned layer;
   providing a nonmagnetic spacer layer;
   providing a free layer, the nonmagnetic spacer layer residing between the pinned layer and the free layer; and
   sputtering a current confinement layer, the current confinement layer including an insulator and a conductor that are immiscible, the conductor forming a plurality of nano-dots in an insulating matrix, at least a portion of the plurality of nano-dots extending through the current confinement layer; and
   completing fabrication of the current confinement layer without performing an anneal.

2. The method of claim 1 wherein the sputtering step further includes the step of:
   sputtering the current confinement layer on the free layer.

3. The method of claim 1 wherein the sputtering step (d) further includes the step of:
   (d1) sputtering the current confinement layer between the free layer and the nonmagnetic spacer layer.

4. The method of claim 1 wherein the sputtering step (d) further includes the step of:
   (d1) sputtering the current confinement layer between the nonmagnetic spacer layer and the pinned layer.

5. The method of claim 1 wherein the pinned layer providing step (a) further includes the steps of:
   (a1) providing a first ferromagnetic layer;
   (a2) providing a spacer layer; and
   (a3) providing a second ferromagnetic layer, the spacer layer configured such that the first ferromagnetic layer and the second ferromagnetic layer are antiferromagnetically aligned.

6. The method of claim 5 wherein the sputtering step (d) further includes the step of:
   (d1) sputtering the current confinement layer on the first ferromagnetic layer.

7. The method of claim 5 wherein the sputtering step (d) further includes the step of:
   (d1) sputtering the current confinement layer on the spacer layer.

8. The method of claim 5 wherein the sputtering step (d) further includes the step of:
   (d1) sputtering the current confinement layer within the second ferromagnetic layer.

9. The method of claim 1 wherein the sputtering step (d) further includes the step of:
   (d1) sputtering the current confinement layer within the free layer.

10. The method of claim 1 wherein the sputtering step (d) further includes the step of:
    (d1) sputtering the current confinement layer within the nonmagnetic spacer layer.

11. The method of claim 1 wherein the sputtering step (d) further includes the step of:
    (d1) sputtering the current confinement layer from a composite target including the insulator and the conductor.

12. The method of claim 1 wherein the sputtering step (d) further includes the step of:

(d1) co-sputtering the current confinement layer from a first target including the insulator and a second target including the conductor.

13. A method for providing a current confined magnetic element comprising:

providing a pinned layer;

providing a nonmagnetic spacer layer;

providing a free layer, the nonmagnetic spacer layer residing between the pinned layer and the free layer; and sputtering a current confinement layer for the current confined magnetic element, the current confinement layer including an insulator and a conductor that are immiscible, the free layer residing between the current confinement layer and the pinned layer with no other current confinement layer between the free layer and the pinned layer, the conductor forming a plurality of nano-dots in an insulating matrix, at least a portion of the plurality of nano-dots extending through the current confinement layer; and completing fabrication of the current confinement layer without performing an anneal.

14. A method for providing a current confined magnetic element comprising:

providing a pinned layer;

providing a nonmagnetic spacer layer;

providing a free layer, the nonmagnetic spacer layer residing between the pinned layer and the free layer; and sputtering a current confinement layer, the current confinement layer including an insulator and a conductor that are immiscible, the conductor forming a plurality of nano-dots in an insulating matrix, at least a portion of the plurality of nano-dots extending through the current confinement layer, the conductor including Ni, and;

completing fabrication of the current confinement layer without performing an anneal.

* * * * *